(12) United States Patent
Lee et al.

(10) Patent No.: US 11,611,315 B2
(45) Date of Patent: Mar. 21, 2023

(54) NOISE FILTERING CIRCUIT AND AN ELECTRONIC CIRCUIT INCLUDING THE SAME

(71) Applicant: SAMSUNG ELECTRONICS CO., LTD., Suwon-si (KR)

(72) Inventors: Jong Mi Lee, Pohang-si (KR); Yong Lim, Seoul (KR); Chilun Lo, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 115 days.

(21) Appl. No.: 17/173,943

(22) Filed: Feb. 11, 2021

(65) Prior Publication Data
US 2021/0336586 A1    Oct. 28, 2021

(30) Foreign Application Priority Data
Apr. 28, 2020  (KR) .......................... 10-2020-0051415

(51) Int. Cl.
*H03F 3/04*  (2006.01)
*H03F 1/30*  (2006.01)
*H03F 3/21*  (2006.01)
*H03F 1/26*  (2006.01)

(52) U.S. Cl.
CPC ............... *H03F 1/301* (2013.01); *H03F 1/26* (2013.01); *H03F 3/211* (2013.01); *H03F 2200/294* (2013.01); *H03F 2200/372* (2013.01)

(58) Field of Classification Search
CPC . H03F 1/301; H03F 1/26; H03F 3/211; H03F 2200/294; H03F 2200/372; H03F 3/45475; H03F 3/45183; H03F 3/45479; H03F 2203/45138; G05F 1/468; G05F 3/262; G01C 7/02; G01C 5/146; G01C 13/004
USPC ........................................ 330/69, 259, 260
See application file for complete search history.

(56) References Cited

U.S. PATENT DOCUMENTS

| | | | | |
|---|---|---|---|---|
| 4,122,417 A | * | 10/1978 | Takasaki ................ | H04B 3/145 333/28 R |
| 5,315,266 A | * | 5/1994 | Lorenz .................. | H03F 3/3071 330/255 |
| 5,917,368 A | | 6/1999 | Tan et al. | |
| 6,388,511 B1 | | 5/2002 | Kanao | |
| 6,707,340 B1 | * | 3/2004 | Gough .................... | H03F 1/083 323/280 |
| 6,885,244 B2 | * | 4/2005 | Shor ....................... | H03F 3/211 330/253 |

(Continued)

FOREIGN PATENT DOCUMENTS

| | | |
|---|---|---|
| JP | 2003-158431 | 5/2003 |
| JP | 2006-059057 | 3/2006 |
| JP | 5555600 | 7/2014 |

*Primary Examiner* — Khanh V Nguyen
(74) *Attorney, Agent, or Firm* — F. Chau & Associates, LLC

(57) ABSTRACT

A noise filtering circuit including: an amplifier which receives a reference bias through a first input terminal, generates an amplified output voltage and outputs the amplified output voltage through an output terminal, and receives an output voltage generated on the basis of the amplified output voltage through a second input terminal; a resistance component connected between the output terminal of the amplifier and the second input terminal; and a capacitor connected to the resistance component.

14 Claims, 13 Drawing Sheets

(56) References Cited

U.S. PATENT DOCUMENTS

| | | |
|---|---|---|
| 6,998,905 B2 | 2/2006 | North |
| 7,298,221 B2 | 11/2007 | Yan |
| 7,551,021 B2 | 6/2009 | Florescu |
| 7,586,371 B2 * | 9/2009 | Tachibana ........... H03F 3/45475 330/252 |
| 7,622,988 B2 | 11/2009 | Denison et al. |
| 7,622,994 B2 * | 11/2009 | Galal ...................... H03F 1/301 330/296 |
| 7,868,808 B2 | 1/2011 | Caplan et al. |
| 7,986,188 B2 * | 7/2011 | Fujiwara ................. G05F 1/575 330/257 |
| 8,866,553 B2 * | 10/2014 | Botker ................ H03F 3/45475 330/99 |
| 9,831,892 B1 | 11/2017 | Tsai |
| 2012/0299655 A1 * | 11/2012 | Pan ..................... G11C 11/4091 365/226 |
| 2013/0106516 A1 * | 5/2013 | Lin ....................... H03M 1/002 330/260 |

* cited by examiner 100b-4

100b-5

100b-6

100b-7

NOISE FILTERING CIRCUIT AND AN ELECTRONIC CIRCUIT INCLUDING THE SAME

This application claims priority under 35 U.S.C. 119 to Korean Patent Application No. 10-2020-0051415, filed on Apr. 28, 2020, the disclosure of which is incorporated by reference herein in its entirety.

TECHNICAL FIELD

The present inventive concept relates to a noise filtering circuit and an electronic circuit including the same.

DESCRIPTION OF THE RELATED ART

An electronic circuit uses a bias circuit to apply a desired value of voltage or current. For example, the bias circuit supplies a steady voltage or current. Attributes of the bias circuit may change, depending on attributes (e.g., transconductance, output resistance, mismatch, gate leakage current, temperature, etc.) of the electronic circuit that can change in various environments where the electronic circuit is used.

Accordingly, a bias circuit with attributes that do not change in different environments has been developed. For example, this bias circuit may provide a desired current and/or voltage with low variation in various environments.

However, when a thermal noise and/or a flicker noise generated by the bias circuit is added to the current and/or voltage provided by the bias circuit, a low noise circuit configuration may be employed.

SUMMARY

According to an exemplary embodiment of the present inventive concept, there is provided a noise filtering circuit including: an amplifier which receives a reference bias through a first input terminal, generates an amplified output voltage and outputs the amplified output voltage through an output terminal, and receives an output voltage generated on the basis of the amplified output voltage through a second input terminal, a resistance component connected between the output terminal of the amplifier and the second input terminal; and a capacitor connected to the resistance component.

According to an exemplary embodiment of the present inventive concept, there is provided a noise filtering circuit including: an amplifier to which a reference bias is input through a first input terminal; a first capacitor including a first terminal connected to a second input terminal of the amplifier, and a second terminal connected to an output terminal of the amplifier; a first resistance component including a first terminal connected to the output terminal, and a second terminal connected to a filtering terminal; a second resistance component including a first terminal connected to the second input terminal, and a second terminal connected to the filtering terminal; and a second capacitor connected to the filtering terminal, wherein an output voltage, in which noise of the reference bias is filtered, is output through the filtering terminal.

According to an exemplary embodiment of the present inventive concept, there is provided an electronic circuit including: a reference bias generating circuit; a noise filtering circuit to which a reference bias generated by the reference bias generating circuit is input; and a bias receiving circuit which receives an output bias through a filtering terminal, wherein the output bias is obtained by filtering noise of the reference bias, wherein the noise filtering circuit includes: an amplifier which includes a first input terminal to which the reference bias is input, an output terminal through which an amplified reference bias is output, and a second input terminal connected to the filtering terminal, a resistance component connected between the output terminal and the filter terminal, and a capacitor connected to the filtering terminal.

According to an exemplary embodiment of the present inventive concept, there is provided a noise filtering circuit including: an amplifier including a first input terminal, a second input terminal and an output terminal, wherein the amplifier is configured to receive a reference bias at the first input terminal, generate an amplified output voltage, output the amplified output voltage through the output terminal, and receive an output voltage generated using the amplified output voltage at the second input terminal; a resistance component connected to the output terminal; and a capacitor connected to the resistance component.

DETAILED DESCRIPTION OF THE EMBODIMENTS

Figure 1:
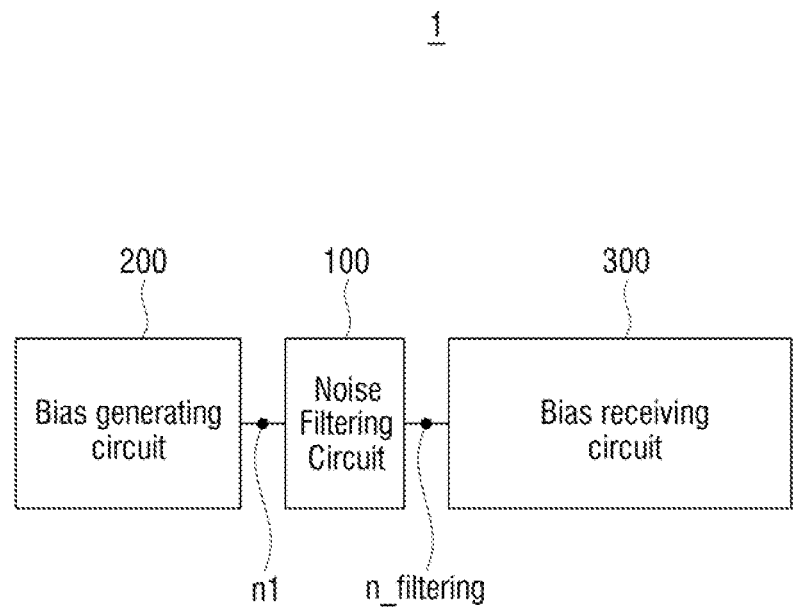
FIG. 1 is a block diagram showing an electronic circuit including a noise filtering circuit according to exemplary embodiments of the present inventive concept.

FIG. 1 is a block diagram showing an electronic circuit including a noise filtering circuit according to exemplary embodiments of the present inventive concept.

Referring to FIG. 1, an electronic circuit 1 including a noise filtering circuit according to exemplary embodiments of the present inventive concept includes a noise filtering circuit 100, a reference bias generating circuit 200, and a reference bias receiving circuit 300.

The reference bias generating circuit 200 is connected to the noise filtering circuit 100 through a first input terminal n1. The reference bias generating circuit 200 generates a reference bias and transmits it to the noise filtering circuit 100 through the first input terminal n1.

The reference bias receiving circuit 300 is connected to the noise filtering circuit 100 according to exemplary embodiments of the present inventive concept through a filtering terminal n_filtering. The reference bias receiving circuit 300 receives the reference bias, in which noise is filtered through the noise filtering circuit 100 according to exemplary embodiments of the present inventive concept, through the filtering terminal n_filtering. In other words, the reference bias filtering circuit 300 receives a noise filtered version of the reference bias from the noise filtering circuit 100.

The noise filtering circuit 100 according to exemplary embodiments of the present inventive concept filters noise in the reference bias generated by the reference bias generating circuit 200. In the case of an electronic circuit that requires a high resolution, the noise included in the reference bias may become a bottleneck of the entire performance of the electronic circuit. Therefore, filtering of noise included in the reference bias is performed.

The noise filtering circuit 100 according to exemplary embodiments of the present inventive concept may include a feedback circuit including an amplifier, thereby compensating for a reference bias distortion caused by a leakage current generated in the filtering terminal n_filtering or the bias receiving circuit 300. Further, the noise filtering circuit 100 according to exemplary embodiments of the present inventive concept may include a turn-off transistor and/or a pseudo resistor to realize a high resistance in a small area. The structure and operation of the noise filtering circuit 100 according to exemplary embodiments of the present inventive concept which filters the noise of the reference bias generated from the reference bias generating circuit 200 will be explained in detail with reference to the following drawings.

FIGS. 2 to 5 are circuit diagrams showing a noise filtering circuit including a first resistance component element according to exemplary embodiments of the present inventive concept.

Figure 2:
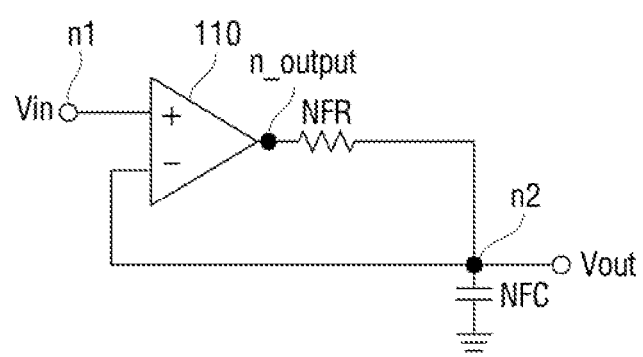
FIGS. 2, 3, 4 and 5 are circuit diagrams showing a noise filtering circuit including a first resistance component element according to exemplary embodiments of the present inventive concept.

Referring to FIGS. 1 and 2, a noise filtering circuit 100a-1 according to exemplary embodiments of the present inventive concept includes an amplifier 110, a first resistance component element NFR, and a capacitor NFC.

The amplifier 110 of the noise filtering circuit 100a-1 according to exemplary embodiments of the present inventive concept receives a reference bias Vin through a first input terminal n1 and receives an output voltage Vout through the second input terminal n2 to output an amplified voltage to the output terminal n_output. The second input terminal n2 to which the output voltage Vout is transferred may be the same as the filtering terminal n_filtering of FIG. 1.

The amplifier 110 receives a feedback of the output voltage Vout through the second input terminal n2, and may adjust the output voltage Vout to have the same level as the reference bias Vin that is input through the first input terminal n1. In other words, even if a leakage current occurs in the bias receiving circuit 300 or the filtering terminal n_filtering, the leakage current is compensated with the feedback using the amplifier 110. Thus, the output voltage Vout transferred through the second input terminal n2 or the filtering terminal n_filtering may have the same level as the reference bias Vin. Therefore, the output voltage Vout of the same level as the reference bias Vin generated by the reference bias generating circuit 200 may be transferred to the reference bias receiving circuit 300 through the second input terminal n2 or the filtering terminal n_filtering.

However, the output voltage Vout received by the reference bias receiving circuit 300 may include noise of the reference bias Vin itself as well as noise generated in the process of transferring the reference bias Vin. Therefore, the noise is removed by the noise filtering circuit 100a-1 according to exemplary embodiments of the present inventive concept. To accomplish this, the noise filtering circuit 100a-1 according to exemplary embodiments of the present inventive concept may further include the first resistance component element NFR and the capacitor NFC, in addition to the amplifier 110.

For example, the first resistance component element NFR may be connected between the output terminal n_output of the amplifier 110 and the second input terminal n2 to compensate for the leakage current that may occur at the second input terminal n2, while filtering the noise in a region higher than a certain bandwidth.

The level of the output voltage Vout may rise due to the leakage current generated at the second input terminal n2. The output voltage Vout with the rise in level due to the leakage current is input to the amplifier 110 through the second input terminal n2. After that, the amplified voltage amplified through the amplifier 110 is transferred through the output terminal n_output. At this time, the level of the amplified voltage transferred through the output terminal n_output may be decreased, since the leakage current flows through the first resistance component element NFR. In other words, the voltage increase due to the leakage current is reduced or cancelled through the feedback using the amplifier 110, as well as by the first resistance component element NFR and the capacitor NFC, and at the same time, the noise of the reference bias Vin itself and the noise generated in the process of transferring the reference bias Vin may be filtered in a region higher than a certain bandwidth.

For the noise filtering circuit 100a-1 according to exemplary embodiments of the present inventive concept to efficiently execute the noise filtering, the first resistance component element NFR having a high resistance value and a capacitor NFC having a high capacitance value may be employed. This enables the filtering bandwidth to be lowered.

Figure 3:
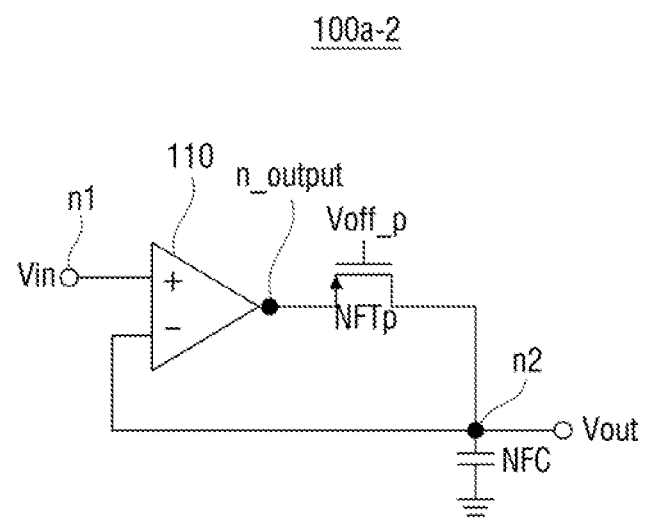
Figure 4:
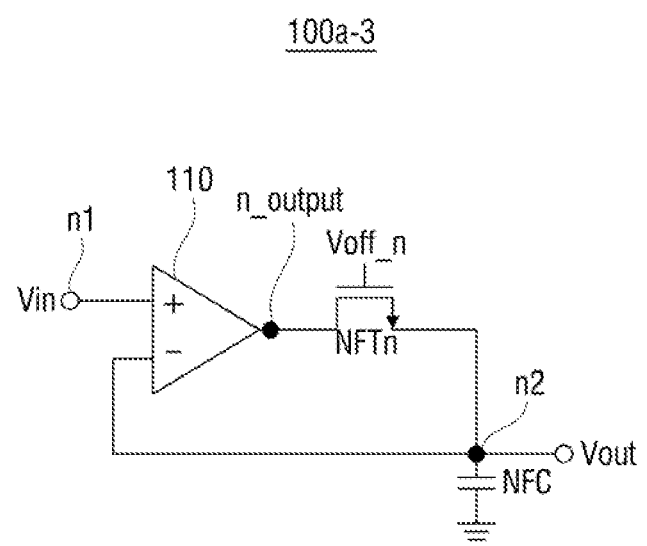
Figure 5:
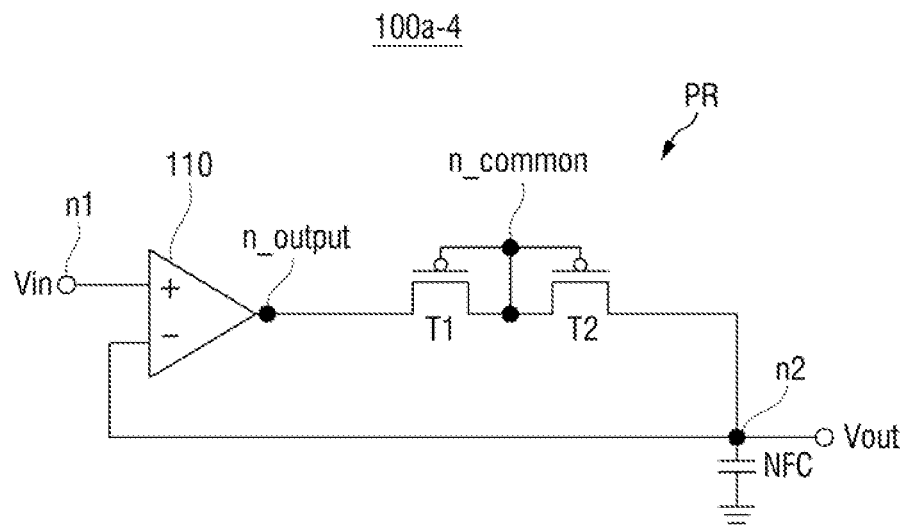

However, the first resistance component element NFR having a high resistance value and the capacitor NFC having a high capacitance value may occupy a large area. Therefore, the first resistance component element NFR included in the noise filtering circuit according to exemplary embodiments of the present inventive concept may be formed by a turned-off and/or pseudo resistor as shown in FIGS. 3 to 5 below. Hereinafter, repeated descriptions for the same or similar elements in FIGS. 1 and 2 may be omitted.

Referring to FIGS. 2 and 3, a noise filtering circuit 100a-2 according to exemplary embodiments of the present inventive concept in which the first resistance component element NFR is formed by a turn-off p-type metal oxide semiconductor (PMOS) transistor NFTp will be explained.

One terminal (e.g., a source terminal) of the PMOS transistor NFTp is connected to the output terminal n_output of the amplifier 110. Further, the other terminal (e.g., a drain terminal) of the PMOS transistor NFTp is connected to the second input terminal n2 to which the output voltage Vout is transferred. For example, a first terminal of the PMOS transistor NFTp is connected to the output terminal n_output of the amplifier 110 and a second terminal of the PMOS transistor NFTp is connected to the second input terminal n2. Finally, the gate of the PMOS transistor NFTp is connected to the off-voltage Voff_p.

In this case, an absolute value of the off-voltage Voff_p may have a voltage level lower than an absolute value of a threshold voltage of the PMOS transistor NFTp. Therefore, the PMOS transistor NFTp operates in a state of turn-off or sub-threshold voltage, and may act like the first resistance component element NFR having a high resistance value. Further, since the noise filtering circuit 100a-2 according to exemplary embodiments of the present inventive concept is formed by the PMOS transistor NFTp having a very small area, the PMOS transistor NFTp may act as the first resistance component element NFR having a high resistance value but within a smaller area.

The first resistance component element NFR is not limited to the turn-off PMOS transistor NFTp, but may be formed by a turn-off n-type metal oxide semiconductor (NMOS) transistor NFTn.

Referring to FIGS. 2 and 4, a noise filtering circuit 100a-3 according to exemplary embodiments of the present inventive concept in which the first resistance component element NFR is formed by a turn-off NMOS transistor NFTn will be explained.

One terminal (e.g., a drain terminal) of the NMOS transistor NFTn is connected to the output terminal n_output of the amplifier 110. In addition, the other terminal (e.g., a source terminal) of the NMOS transistors NFTn is connected to the second input terminal n2 to which the output voltage Vout is transferred. For example, a first terminal of the NMOS transistor NFTn is connected the output terminal n_output of the amplifier 110 and a second terminal of the NMOS transistor NFTn is connected to the second input terminal n2. Finally, the gate of the NMOS transistor NFTn is connected to the off-voltage Voff_n.

In this case, the off-voltage Voff_n may have a voltage level lower than the threshold voltage of the NMOS transistor NFTn. Therefore, the NMOS transistor NFTn exists in a turn-off state, and may act like a first resistance component element NFR having a high resistance value. Further, since the noise filtering circuit 100a-3 according to exemplary embodiments of the inventive concept is formed by the NMOS transistor NFTn having a very small area, the NMOS transistor NFTn may act as a first resistance component element NFR having a high resistance value but in a smaller area.

The first resistance component element NFR is not limited to the aforementioned turn-off PMOS transistor NFTp and/or turn-off NMOS transistor NFTn, and may be formed by a pseudo resistor.

Referring to FIGS. 2 and 5, a noise filtering circuit 100a-4 according to exemplary embodiments of the inventive concept in which the first resistance component element NFR is formed by a pseudo resistor PR will be explained.

The pseudo resistor PR may be formed by connection of the PMOS first transistor T1 and the PMOS second transistor T2 to each other. For example, one terminal (e.g., a source terminal) of the PMOS first transistor T1 of the pseudo resistor PR and one terminal (e.g., a source terminal) of the second PMOS transistor T2 of the pseudo resistor PR may be connected to each other through a common terminal n_common. In other words, the source terminals of the PMOS first transistor T1 and the PMOS second transistor T2 may be directly connected to each other. In addition, both the gate of the PMOS first transistor T1 and the gate of the PMOS second transistor T2 may be connected to each other through the common terminal n_common. In this case, the other terminal (e.g., a drain terminal) of the PMOS first transistor T1 may be connected to the output terminal n_output of the amplifier 110. In addition, the other terminal (e.g., the drain terminal) of the PMOS second transistor T2 may be connected to the second input terminal n2.

In other words, the pseudo resistor PR has a form in which two diodes are connected, and the two diodes are connected in series in a forward direction and a reverse direction to act as a first resistance component element NFR having a high resistance. In addition, since the noise filtering circuit 100a-4 according to exemplary embodiments of the present inventive concept includes the pseudo resistor PR formed by the PMOS transistor (e.g., a first transistor T1 and a second transistor T2) having a very small area. Therefore, the PMOS transistor may act as the first resistance component element NFR having a high resistance value within a smaller area.

The configuration of the noise filtering circuits (e.g., 100a-1 to 100a-4) of FIGS. 2 to 5 according to exemplary embodiments of the present inventive concept is not limited thereto, and the first resistance component element NFR may be formed by a plurality of turn-off transistors. Further, the first resistance component element NFR may be formed by a plurality of pseudo resistors. Further, the first resistance component element NFR may be formed by a plurality of pseudo resistors and a plurality of turn-off transistors.

In the noise filtering circuits of FIGS. 2 to 5 (e.g., 100a-1 to 100a-4) according to exemplary embodiments of the present inventive concept described above, the noise filtering bandwidth may increase from 1/(RC) which is a bandwidth of a general resistive-capacitive (RC) low pass filter, due to the voltage gain of the amplifier 110. Therefore, a second resistance component element and a pole compensation capacitor may be used to reduce the noise filtering bandwidth increased due to the voltage gain of the amplifier 110 of the noise filtering circuits (e.g., 100a-1 to 100a-4 of FIGS. 2 to 5) according to exemplary embodiments of the present inventive concept described above. The noise filtering circuit according to exemplary embodiments of the present inventive concept using a second resistance component element and a pole compensation capacitor will be explained through FIGS. 6 to 15 below.

Hereinafter, description of FIGS. 6 to 15 will be made by omitting certain repeated parts of the aforementioned embodiments as like reference numerals may refer to like elements.

FIGS. 6 to 15 are circuit diagrams showing the noise filtering circuit including a first resistance component element, a second resistance component element, and a pole compensation capacitor according to exemplary embodiments of the present inventive concept.

Figure 6:
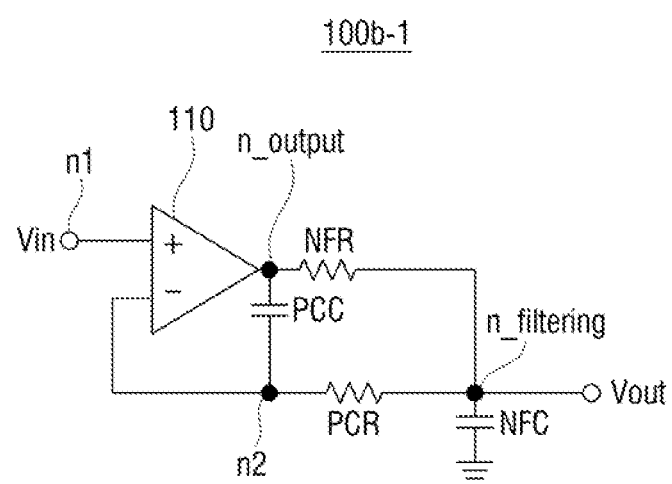
FIGS. 6, 7, 8, 9, 10, 11, 12, 13, 14 and 15 are circuit diagrams showing the noise filtering circuit including a first resistance component element, a second resistance component element, and a pole compensation capacitor according to exemplary embodiments of the present inventive concept.

Referring to FIGS. 1 and 6, a noise filtering circuit 100b-1 of FIG. 6 according to exemplary embodiments of the present inventive concept further includes a pole compensation capacitor PCC and a second resistance component element PCR, unlike the noise filtering circuit 100a-1 of FIG. 2.

The pole compensation capacitor PCC of the noise filtering circuit 100b-1 according to exemplary embodiments of the present inventive concept is connected between the output terminal n_output of the amplifier 110 and the second input terminal n2. Further, the second resistance component element PCR is connected between the second input terminal n2 and the filtering terminal n_filtering.

The amplifier 110 of the noise filtering circuit 100b-1 according to exemplary embodiments of the present inventive concept receives a reference bias Vin through the first input terminal n1, amplifies a voltage level difference between the reference bias Vin and the bias of the second input terminal n2, and outputs the amplified voltage to the output terminal n_output. The amplified voltage may be output to the output voltage Vout through a filtering terminal n_filtering, after the noise is filtered by the first resistance component element NFR and the capacitor NFC. Further, the amplified voltage may reduce the noise filtering bandwidth by the pole compensation capacitor PCC and the second resistance component element PCR.

For example, an output voltage Vout generated by the noise filtering circuit 100a-1 of FIG. 2 according to exemplary embodiments of the present inventive concept in which the second resistance component element PCR and the pole compensation capacitor PCC are not present is expressed by Formula 1.

$$Vout = \frac{Vin}{\left(1 + \frac{1}{A}\right) + \frac{NFR \cdot NFC}{A}} \quad \text{Formula 1}$$

Therefore, the noise filtering bandwidth of the noise filtering circuit 100a-1 of FIG. 2 according to exemplary embodiments of the present inventive concept is expressed by Formula 2.

$$\frac{A}{FR \cdot NFC}\left(1 + \frac{1}{A}\right) \quad \text{Formula 2}$$

In Formula 1 and Formula 2, A is a voltage gain of the amplifier 110, FR is a resistance value of the first resistance component element NFR, and NFC is a capacitance of the capacitor NFC. Since the voltage gain A of the amplifier 110 has a very large value, the noise filtering bandwidth of the noise filtering circuit 100a-1 of FIG. 2 according to exemplary embodiments of the present inventive concept may have a value much larger than the bandwidth of the general RC low pass filter.

Therefore, to reduce the amount of bandwidth increased due to the voltage gain A of the amplifier 110, the second resistive component element PCR and the pole compensation capacitor PCC may be connected to reduce the noise filtering bandwidth. In this case, to effectively reduce the noise filtering bandwidth, the first resistance component element NFR having a high resistance value, the capacitor NFC having a high capacitance value, a second resistance component element PCR having a high resistance value, and the pole compensation capacitor PCC having a high capacitance value may be connected to each other.

However, since the first resistance component element NFR having a high resistance value, the capacitor NFC having a high capacitance value, the second resistance component element PCR having a high resistance value, and the pole compensation capacitor PCC having a capacitance value occupy a large area, they may exceed an area given to an electronic circuit including the noise filtering circuit according to exemplary embodiments of the present inventive concept. Therefore, as shown in FIGS. 7 to 15 below, the first resistance component element NFR and the second resistance component element PCR included in the noise filtering circuit according to exemplary embodiments of the present inventive concept may be formed by a turn-off and/or pseudo resistor. Hereinafter, a description of the repeated parts of contents described above will not be provided.

Figure 7:
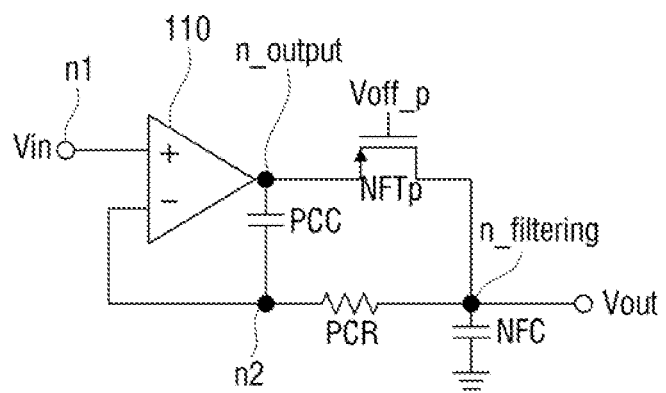

Referring to FIGS. 6 and 7, a noise filtering circuit 100b-2 according to exemplary embodiments of the present inventive concept in which a first resistance component element NFR is formed by a turn-off PMOS transistor NFTp will be explained.

One terminal (e.g., a source terminal) of the PMOS transistor NFTp is connected to the output terminal n_output of the amplifier 110. Further, the other terminal (e.g., a drain terminal) of the PMOS transistor NFTp is connected to a filtering terminal n_filtering to which the output voltage Vout is transferred. Finally, the gate of the PMOS transistor NFTp is connected to the off-voltage Voff_p.

In this configuration, an absolute value of the off-voltage Voff_p may have a voltage level lower than an absolute value of the threshold voltage of the PMOS transistor NFTp. Therefore, the PMOS transistor NFTp may operate in a turned off or sub-threshold voltage state and act like the first resistance component element NFR having a high resistance value. Further, since the noise filtering circuit 100b-2 according to exemplary embodiments of the present inventive concept is formed by the PMOS transistor NFTp having a very small area, the PMOS transistor may act as the first resistance component element NFR having a high resistance value within a smaller area.

The second resistance component element PCR rather than the first resistance component element NFR may be formed by a turn-off PMOS transistor.

A noise filtering circuit 100b-3 according to exemplary embodiments of the present inventive concept in which a second resistance component element PCR is formed by a turn-off PMOS pole compensation transistor PCTp will be explained referring to FIGS. 6 and 8.

One terminal (e.g., a source terminal) of the PMOS pole compensation transistor PCTp is connected to the second input terminal n2. Further, the other terminal (e.g., a drain terminal) of the PMOS pole compensation transistor PCTp is connected to a filtering terminal n_filtering to which the output voltage Vout is transferred. For example, the source terminal of the PMOS pole compensation transistor PCTp is connected to a terminal of the pole compensation capacitor PCC and the drain terminal of the PMOS pole compensation transistor PCTp is connected to an end of the first resistance component element NFR. Finally, the gate of the PMOS pole compensation transistor PCTp is connected to the off-voltage Voff_p.

In this configuration, the absolute value of the off-voltage Voff_p may have a voltage level lower than the absolute value of the threshold voltage of the PMOS pole compensation transistor PCTp. Therefore, the PMOS pole compensation transistor PCTp exists in a turn-off state and may act like a second resistance component element PCR having a high resistance value. Further, since the noise filtering circuit 100b-3 according to exemplary embodiments of the present inventive concept is formed by the PMOS pole compensation transistor PCTp having a very small area, the PMOS pole compensation transistor PCTp may act as the second resistance component element PCR having a high resistance value within a smaller area.

In the noise filtering circuit according to exemplary embodiments of the present inventive concept, both the first resistance component element NFR and the second resistance component element PCR may be formed by a turn-off PMOS transistor. In other words, both the first resistance component element NFR and the second resistance component element PCR may include a turn-off PMOS transistor.

Figure 9:
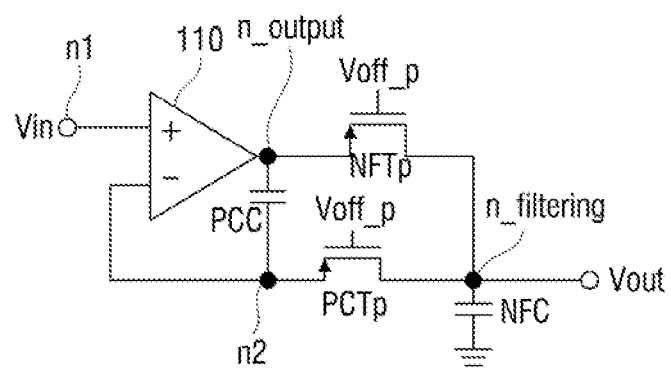

Referring to FIGS. 6 and 9, in a noise filtering circuit 100b-4 according to exemplary embodiments of the present inventive concept, a first resistance component element NFR may be formed by a turn-off PMOS transistor NFTp, and a second resistance component element PCR may be formed by a turn-off PMOS pole compensation transistor PCTp. Since the configurations and operations of each of the turn-off PMOS transistor NFTp and the turn-off PMOS pole compensation transistor PCTp are the same as those described above, a description thereof will not be provided.

The noise filtering circuit 100b-4 according to exemplary embodiments of the present inventive concept may be formed by the PMOS transistor NFTp and the PMOS pole compensation transistor PCTp having a very small area. Therefore, in the electronic circuit including the noise filtering circuit 100b-4 according to exemplary embodiments of the present inventive concept, the PMOS transistor NFTp may act as a the first resistance component element NFR having a high resistance value. Further, in the electronic circuit including the noise filtering circuit 100b-4 according to exemplary embodiments of the present inventive concept, the PMOS pole compensation transistor PCTp may act as a second resistance component element PCR having a high resistance value.

Figure 8:
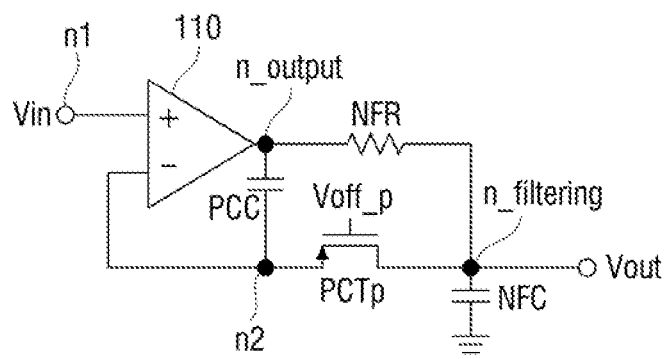

Unlike the description of FIGS. 7 to 9, the turn-off transistor may be formed by an NMOS transistor.

Figure 10:
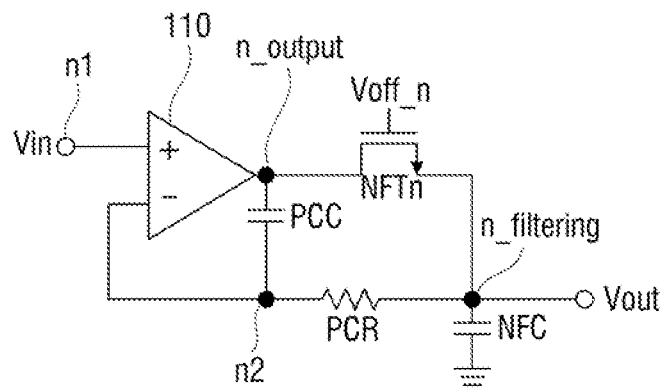

A noise filtering circuit 100b-5 according to exemplary embodiments of the present inventive concept in which a first resistance component element NFR is formed by a turn-off NMOS transistor NFTn will be explained referring to FIGS. 6 and 10.

One terminal (e.g., a drain terminal) of the NMOS transistor NFTn is connected to the output terminal n_output of the amplifier 110. In addition, the other terminal (e.g., a source terminal) of the NMOS transistor NFTn is connected to a filtering terminal n_filtering to which the output voltage Vout is transferred. Finally, the gate of the NMOS transistor NFTn is connected to the off-voltage Voff_n.

In this configuration, an absolute value of the off-voltage Voff_n may have a voltage level lower than a threshold voltage of the NMOS transistor NFTn. Therefore, the NMOS transistor NFTn operates in a turn-off or sub-threshold voltage state, and may act like a first resistance component element NFR having a high resistance value. Further, since the noise filtering circuit 100b-5 according to exemplary embodiments of the present inventive concept is formed by the NMOS transistor NFTn having a very small area, the NMOS transistor NFTn may act as a first resistance component element NFR having a high resistance value within an electronic circuit including the noise filtering circuit 100b-5 according to exemplary embodiments of the present inventive concept.

The second resistance component element PCR rather than the first resistance component element NFR may be formed by a turn-off NMOS transistor.

Figure 11:
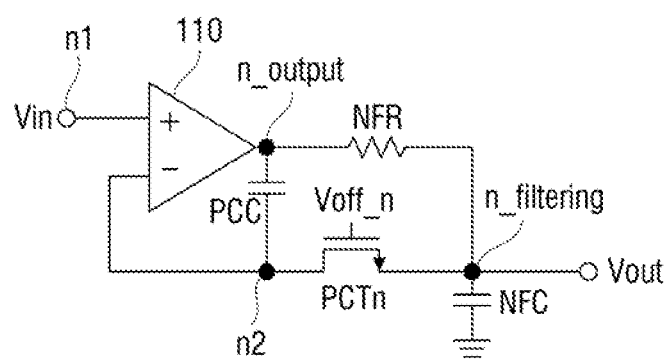

A noise filtering circuit 100b-6 according to exemplary embodiments of the present inventive concept in which the second resistance component element PCR is formed by a turn-off NMOS pole compensation transistor PCTn will be explained referring to FIGS. 6 and 11.

One terminal (e.g., a drain terminal) of the NMOS pole compensation transistor PCTn is connected to the second input terminal n2. In addition, the other terminal (e.g., a source terminal) of the NMOS pole compensation transistor PCTn is connected to a filtering terminal n_filtering to which the output voltage Vout is transferred. For example, the drain terminal of the NMOS pole compensation transistor PCTn is connected to a terminal of the pole compensation capacitor PCC and the source terminal of the NMOS pole compensation transistor PCTn is connected to an end of the first resistance component element NFR. Finally, the gate of the NMOS pole compensation transistor PCTn is connected to the off-voltage Voff_n.

In this configuration, the off-voltage Voff_n may have a voltage level lower than the threshold voltage of the NMOS pole compensation transistor PCTn. Therefore, the NMOS pole compensation transistor PCTn exists in a turn-off state and may act like a second resistance component element PCR having a high resistance value. Further, since the noise filtering circuit 100b-6 according to exemplary embodiments of the present inventive concept is formed by the NMOS pole compensation transistor PCTn having a very small area, the NMOS pole compensation transistor PCTn may act as a second resistance component element PCR having a high resistance value within the electronic circuit including the noise filtering circuit 100b-6 according to exemplary embodiments of the present inventive concept.

In the noise filtering circuit according to exemplary embodiments of the present inventive concept, both the first resistance component element NFR and the second resistance component element PCR may be formed by a turn-off NMOS transistor. In other words, both the first resistance component element NFR and the second resistance component element PCR may include a turn-off NMOS transistor.

Figure 12:
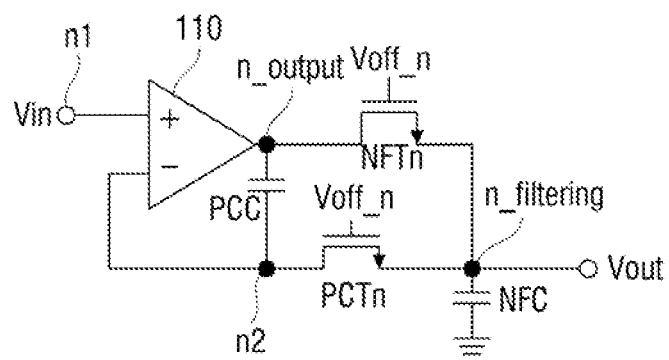

Referring to FIGS. 6 and 12, in a noise filtering circuit 100b-7 according to exemplary embodiments of the present inventive concept, a first resistance component element NFR may be formed by a turn-off NMOS transistor NFTn, and a second resistance component element PCR may be formed by a turn-off NMOS pole compensation transistor PCTn. Since the configurations and operations of each of the turn-off NMOS transistor NFTn and the turn-off NMOS pole compensation transistor PCTn are essentially the same as those described above, a repeated explanation will not be provided.

The noise filtering circuit 100b-7 according to exemplary embodiments of the present inventive concept may be formed by the NMOS transistor NFTn and the NMOS pole compensation transistor PCTN having a very small area. Therefore, within the electronic circuit including the noise filtering circuit 100b-7 according to exemplary embodiments of the present inventive concept, the NMOS transistor NFTn may act as the first resistance component element NFR having a high resistance value. In addition, within the electronic circuit including the noise filtering circuit 100b-7 according to exemplary embodiments of the present inventive concept, the NMOS pole compensation transistor PCTN may act as a second resistance component element PCR having a high resistance value.

Unlike the noise filtering circuits 100b-2 to 100b-7 of FIGS. 7 to 12 according to exemplary embodiments of the present inventive concept, the first resistance component element NFR and/or the second resistance component element PCR is not limited to the above-described turn-off PMOS transistor NFTp and/or turn-off NMOS transistor NFTn, but may be formed by a pseudo resistor.

The first resistance component element NFR and/or the second resistance component element PCR in the noise filtering circuit according to exemplary embodiments of the present inventive concept are not limited to being formed by the turn-off transistor. The noise filtering circuit 100b-8 to 100b-10 according to exemplary embodiments of the present inventive concept in which the first resistance component element NFR and/or the second resistance component element PCR is formed by a pseudo resistor PR will be explained referring to FIGS. 13 to 15 below.

Figure 13:
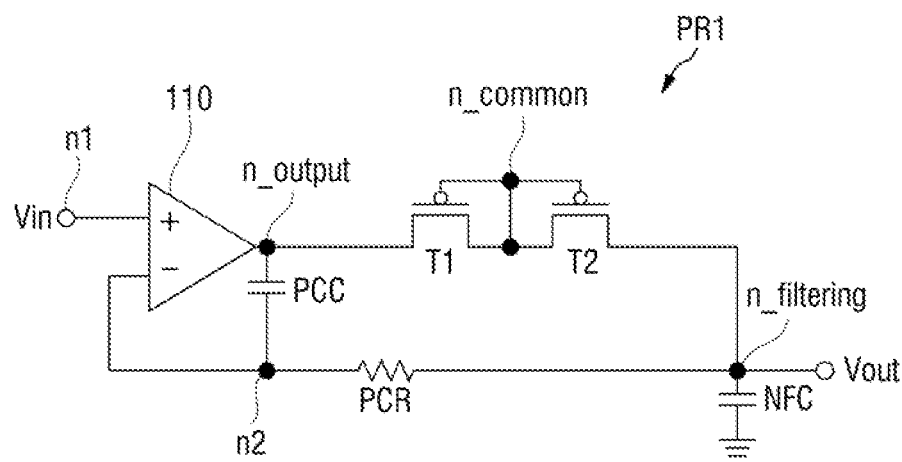

A noise filtering circuit 100*b*-8 according to exemplary embodiments of the present inventive concept in which the first resistance component element NFR is formed by the first pseudo resistor PR1 will be explained referring to FIG. 6 and FIG. 13.

The first pseudo resistor PR1 may be formed by connecting a PMOS first transistor T1 and a PMOS second transistor T2 to each other. For example, one terminal (e.g., the source terminal) of the PMOS first transistor T1 of the first pseudo resistor PR1 and one terminal (e.g., the source terminal) of the PMOS second transistor T2 of the first pseudo resistor PR1 may be connected to each other through a common terminal n_common. Further, both the gate of the PMOS first transistor T1 and the gate of the PMOS second transistor T2 may be connected to each other through the common terminal n_common. In this configuration, the other terminal (e.g., the drain terminal) of the PMOS first transistor T1 may be connected to the output terminal n_output of the amplifier 110. Further, the other terminal (e.g., the drain terminal) of the PMOS second transistor T2 may be connected to the filtering terminal n_filtering.

In other words, the first pseudo resistor PR1 includes two connected diodes, and may serve as the first resistance component element NFR having a high resistance in which the two diodes are connected in series in the forward direction and the reverse direction. In addition, since the noise filtering circuit 100*b*-8 according to exemplary embodiments of the present inventive concept includes the first pseudo resistor PR1 formed by the PMOS transistor having a very small area (e.g., a first transistor T1 and a second transistor T2), the PMOS transistor may serve as a first resistive component element NFR having a high resistance value within an electronic circuit including the noise filtering circuit 100*b*-8 according to exemplary embodiments of the present inventive concept.

Figure 14:
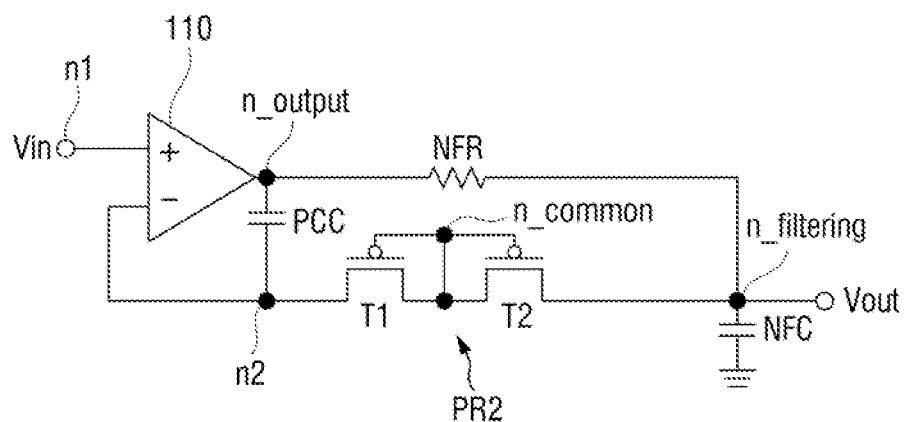

A noise filtering circuit 100*b*-9 according to exemplary embodiments of the present inventive concept in which the second resistance component element PCR is formed by a second pseudo resistor PR2 will be explained referring to FIGS. 6 and 14.

The second pseudo resistor PR2 may be formed by connecting the PMOS first transistor T1 and the PMOS second transistor 12 to each other. For example, one terminal (e.g., the source terminal) of the PMOS first transistor T1 of the second pseudo resistor PR2 and one terminal (e.g., the source terminal) of the PMOS second transistor T2 of the second pseudo resistor PR2 may be connected to each other through the common terminal n_common. Further, both the gate of the PMOS first transistor T1 and the gate of the PMOS second transistor T2 may be connected to each other through the common terminal n_common. In this case, the other terminal (e.g., the drain terminal) of the PMOS first transistor T1 may be connected to the second input terminal n2. Further, the other terminal (e.g., the drain terminal) of the PMOS second transistor T2 may be connected to the filtering terminal n_filtering.

In other words, the second pseudo resistor PR2 has a form in which two diodes are connected, and may serve as a second resistance component element PCR having a high resistance in which the two diodes are connected in series in the forward and the reverse directions. In addition, since the noise filtering circuit 100*b*-9 according to exemplary embodiments of the present inventive concept includes a second pseudo resistor PR2 formed by a PMOS transistor having a very small area (e.g., the first transistor T1 and the second transistor T2), the PMOS transistor may act as the second resistive component element PCR having a high resistance value within an electronic circuit including the noise filtering circuit 100*b*-9 according to exemplary embodiments of the present inventive concept.

Figure 15:
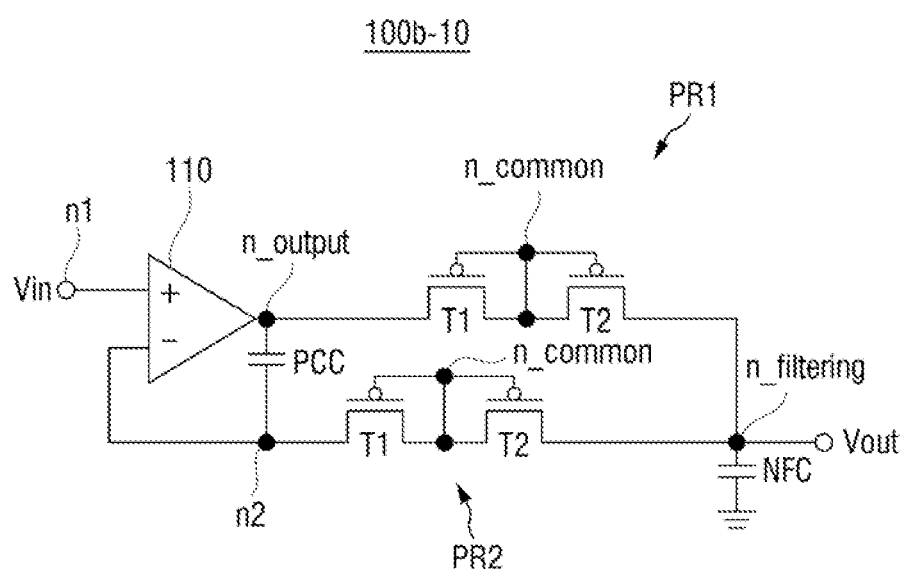

Referring to FIGS. 6 and 15, both the first resistance component element NFR and the second resistance component element PCR of the noise filtering circuit 100*b*-10 according to exemplary embodiments of the present inventive concept may be formed by the first pseudo resistor PR1 and the second pseudo resistor PR2. Since the configurations and operations of the first pseudo resistor PR1 and the second pseudo resistor PR2 of the noise filtering circuit 100*b*-10 according to exemplary embodiments of the present inventive concept are the same as the description of the noise filtering circuits 100*b*-8 and 100*b*-9 of FIGS. 13 and 14, the explanation thereof will not be provided.

The configuration of the noise filtering circuits (e.g., 100*b*-1 to 100*b*-10) of FIGS. 6 to 15 according to exemplary embodiments of the present inventive concept is not limited thereto, and the first resistance component element NFR and/or the second resistance component element PCR may be formed by a plurality of turn-off transistors. Further, the first resistance component element NFR and/or the second resistance component element PCR may be formed by a plurality of pseudo resistors. Further, the first resistance component element NFR and/or the second resistance component element PCR may be formed by a plurality of pseudo resistors and a plurality of turn-off transistors.

Figure 16:
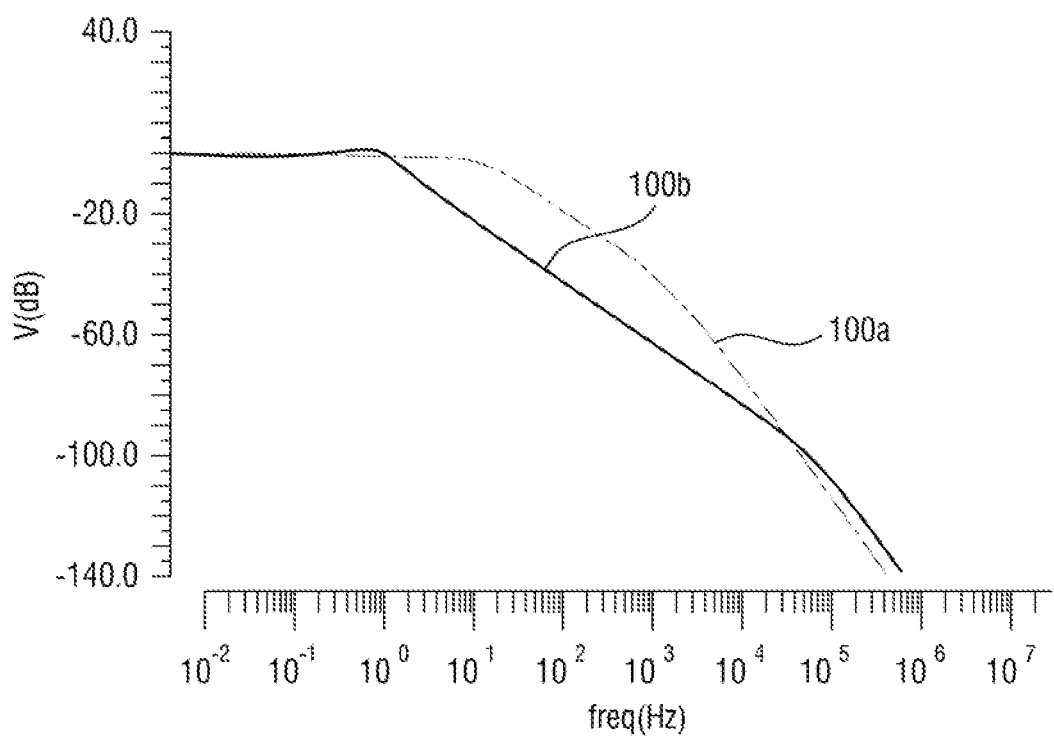
FIG. 16 is a graph showing the voltage gain according to the frequency between the noise filtering circuits according to exemplary embodiments of the present inventive concept.

FIG. 16 is a graph showing the voltage gain according to the frequency between the noise filtering circuits according to exemplary embodiments of the present inventive concept.

Referring to FIGS. 1 to 16, FIG. 16 is a graphs obtained by comparing a voltage gain dB between the noise filtering circuit (e.g., one of 100*a*-1 to 100*a*-4) according to exemplary embodiments of the present inventive concept and the other noise filtering circuit (e.g., one of 100*b*-1 to 100*b*-10) according to exemplary embodiments of the present inventive concept.

A graph in which the voltage gain of the output voltage Vout to the reference bias Vin depending on the frequency of the noise filtering circuit (e.g., one of 100*a*-1 to 100*a*-4) according to exemplary embodiments of the present inventive concept is expressed in decibels dB is an alternate long and short dash line 100*a*.

A graph in which the voltage gain of the output voltage Vout to the reference bias Vin depending on the frequency of the other noise filtering circuit (e.g., one of 100*b*-1 to 100*b*-10) according to exemplary embodiments of the present inventive concept is expressed in decibels dB is a solid line 100*b*.

As shown in the graph of FIG. 16, due to the voltage gain A of the amplifier 110 of the noise filtering circuit (e.g., one of 100*a*-1 to 100*a*-4) according to exemplary embodiments of the present inventive concept, the noise filtering bandwidth (e.g., about 20 Hz in the graph) may have a relatively large value.

However, as in the noise filtering circuit according to exemplary embodiments of the present inventive concept (e.g., one of 100*b*-1 to 100*b*-10), the noise filtering bandwidth (e.g., about 2 Hz in the graph) may be reduced, using a second resistance component element PCR and/or a pole compensation capacitor PCC.

The graph 100*a* of FIG. 16 is a graph measured by the noise filtering circuit including the noise filtering circuit 100*a*-2 of FIG. 3 according to exemplary embodiments of the present inventive concept, and the graph 100*b* of FIG. 16 is a graph measured by the noise filtering circuit including the noise filtering circuit 100*b*-4 of FIG. 9 according to exemplary embodiments of the present inventive concept. It is to be understood that the voltage gain of the present inventive concept is not limited thereto.

For example, the PMOS transistor NFTp of the noise filtering circuit 100a-2 of FIG. 3, from which the graph 100a of FIG. 16 is derived, may have a resistance of about 40 giga-ohms (GΩ). In addition, the capacitor NFC may have 4 pF. In addition, the gain of the amplifier 110 may be about 20 times. In addition, the applied voltage Vin may be about 0.4 V, and thus the pole of the 100a graph of FIG. 16 may be 20.9 Hz.

In addition, for example, the PMOS transistors NFTp and PCTp of the noise filtering circuit 100b-4 of FIG. 9 from which the graph 100b of FIG. 16 is derived may have a resistance of about 40 giga-ohms (GΩ). In addition, the capacitor NFC may have 4 pF. In addition, the pole compensation capacitor PCC may have 8 pF. In addition, the gain of the amplifier 110 may be about 20 times. In addition, the applied voltage Vin may be about 0.4 V, and thus the pole of the 100b graph of FIG. 16 may be 1.99 Hz.

Figure 17:
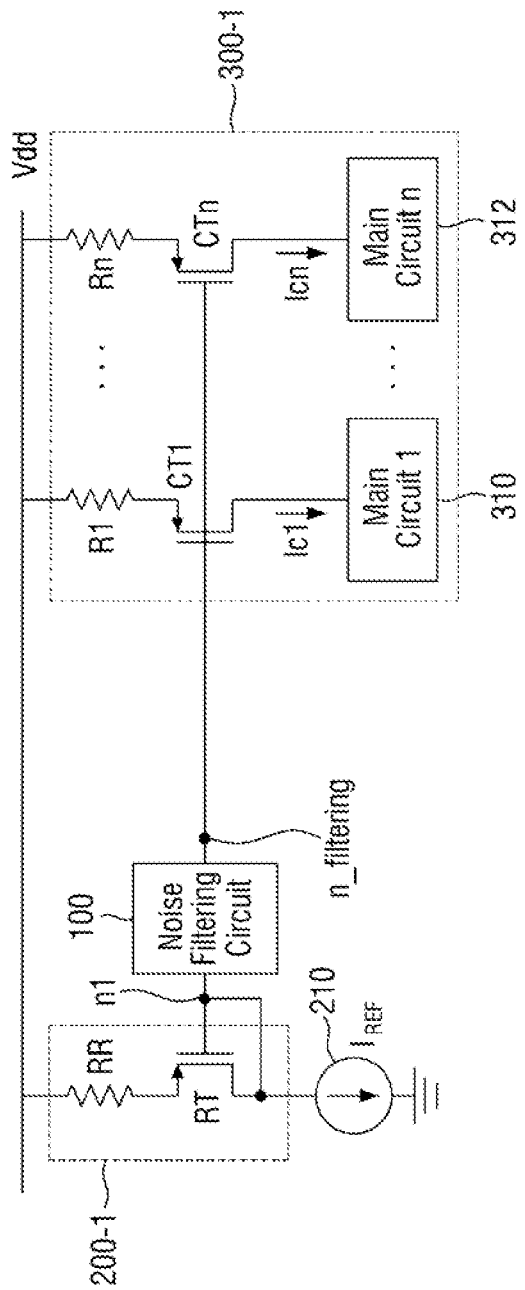
FIG. 17 is a graph showing an electronic circuit (e.g., a Digital to Analog Converter) including the noise filtering circuit according to exemplary embodiments of the present inventive concept.

FIG. 17 is a graph exemplarily showing an electronic circuit e.g., a Digital to Analog Converter (DAC) including the noise filtering circuit according to exemplary embodiments of the present inventive concept.

Referring to FIGS. 1 and 17, the DAC electronic circuit 2 includes a reference bias generating circuit 200-1, a reference current source 210, a noise filtering circuit 100 according to exemplary embodiments of the present inventive concept, and a reference bias receiving circuit 300-1. The noise filtering circuit 100 according to exemplary embodiments of the present inventive concept may include one of the noise filtering circuits (e.g., 100a-1 to 100a-4 and 100b-1 to 100b-10) described above.

In the DAC electronic circuit 2 including the noise filtering circuit 100 according to exemplary embodiments of the present inventive concept, the reference bias generating circuit 200-1 and the noise filtering circuit 100 may be connected to each other through a first input terminal n1. A bias may be generated at the first input terminal n1 of the reference bias generating circuit 200-1 so that a reference current $I_{REF}$ generated in the reference current source 210 flows. Further, in the DAC electronic circuit 2 including the noise filtering circuit 100 according to exemplary embodiments of the present inventive concept, the reference bias receiving circuit 300-1 and the noise filtering circuit 100 may be connected to each other through the filtering terminal n_filtering.

The reference bias generating circuit 200-1 includes a reference resistor RR and a reference transistor RT. One terminal of the reference resistor RR may be connected to the power supply voltage VDD, and the other terminal of the reference resistor RR may be connected to the source terminal of the reference transistor RT. Further, the gate of the reference transistor RT and the drain terminal of the reference transistor RT may be connected to each other. The bias of the first input terminal n1, in other words, the reference bias may be such that the reference current Jr flows in the reference transistor RT.

The noise filtering circuit 100 according to exemplary embodiments of the present inventive concept filters noise of a reference bias transmitted through the first input terminal n1, and transmits the output voltage to the reference bias receiving circuit 300 through the filtering terminal n_filtering.

The reference bias receiving circuit 300 includes first to $n^{th}$ resistors R1 to Rn connected to the power supply voltage VDD at one terminal. The other terminals of each of the first resistor R1 to the $n^{th}$ resistor Rn are connected to the source terminals of a first copy transistor CT1 to an $n^{th}$ copy transistor CTn, respectively. All of the gates of the first copy transistor CT1 to the $n^{th}$ copy transistor CTn may be connected to the filtering terminals n_filtering to receive the noise-filtered reference bias, e.g., the output voltage.

The first copy transistor CT1 to the $n^{th}$ copy transistor CTn are supplied with the gate voltage through the output voltage received through the filtering terminal n_filtering, and may transmit each of a first copy current Ic1 to an $n^{th}$ copy current Icn to each of a first main circuit 310 to an $n^{th}$ main circuit 312.

The first main circuit 310 to the $n^{th}$ main circuit 312 may be any circuit that requires a reference current Ir. For example, the first main circuit 310 to the $n^{th}$ main circuit 312 may be a continuous time delta-sigma modulator.

It is to be understood that the DAC electronic circuit 2 in which the noise filtering circuit 100 according to exemplary embodiments of the present inventive concept is used is not limited to the configuration and elements shown in FIG. 17.

Figure 18:
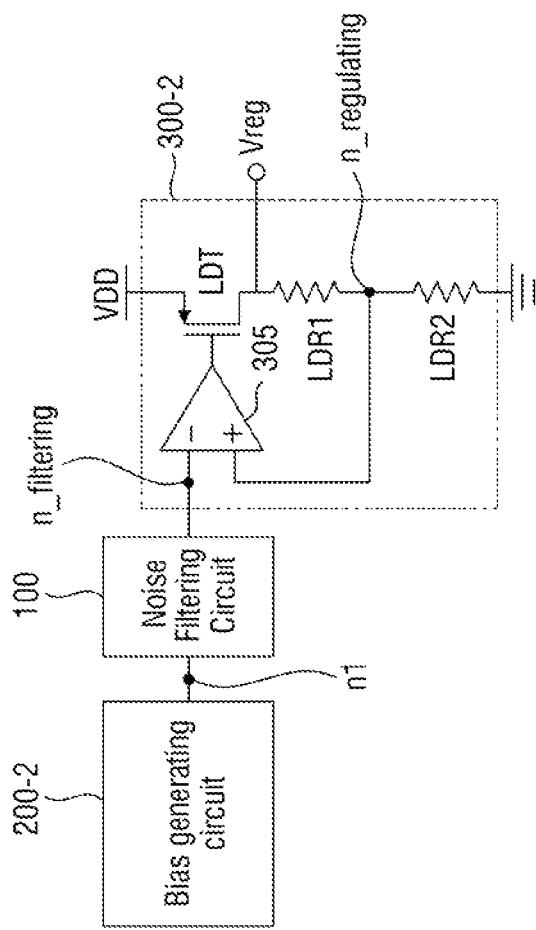
FIG. 18 is a graph showing a low drop output regulator electronic circuit including the noise filtering circuit according to exemplary embodiments of the present inventive concept.

FIG. 18 is a graph showing a low drop output regulator electronic circuit including the noise filtering circuit according to exemplary embodiments of the present inventive concept.

Referring to FIGS. 1 and 18, a low drop output regulator electronic circuit 3 includes a reference bias generating circuit 200-2, a noise filtering circuit 100 according to exemplary embodiments of the present inventive concept, and a reference bias receiving circuit 300-2. The noise filtering circuit 100 may include one of the noise filtering circuits (e.g., 100a-1 to 100a-4 and 100b-1 to 100b-10) according to exemplary embodiments of the present inventive concept described above.

In the low drop output regulator electronic circuit 3 including the noise filtering circuit 100 according to exemplary embodiments of the present inventive concept, the reference bias generating circuit 200-2 and the noise filtering circuit 100 may be connected to each other through the first input terminal n1. In addition, in the low drop output regulator electronic circuit including the noise filtering circuit 100 according to exemplary embodiments of the present inventive concept, the reference bias receiving circuit 300-2 and the noise filtering circuit 100 may be connected to each other through the filtering terminal n_filtering.

The noise filtering circuit 100 according to exemplary embodiments of the present inventive concept filters noise of a reference bias transmitted through the first input terminal n1 to transmit the output voltage to the reference bias receiving circuit 300-1 through the filtering terminal n_filtering.

The reference bias receiving circuit 300-2 may receive as its input the bias provided through the filtering terminal n_filtering to output a regulating voltage Vreg.

In more detail, the reference bias receiving circuit 300-2 includes a regulating amplifier 305, a regulating transistor LDT, a first regulating resistor LDR1, and a second regulating resistor LDR2.

The regulating amplifier 305 receives the output of the filtering terminal n_filtering through a (−) terminal, and is connected to the gate the regulating transistor LDT through its output. The source of the regulating transistor LDT may be connected to the power supply voltage VDD. The drain of the regulating transistor LDT may output the regulating voltage Vreg. In this configuration, the drain of the regulating transistor LDT may be connected to one terminal of the first regulating resistor LDR1. The other terminal of the first regulating resistor LDR1 may be connected to a (+) terminal of the regulating amplifier 305, in other words, the filtering terminal n_filtering. One terminal of the second regulating resistor LDR2 is grounded and the other terminal may be connected to the (+) terminal of the regulating amplifier 305, in other words, the filtering terminal n_filtering.

In other words, the reference bias receiving circuit 300-2 may adjust the regulating voltage Vreg, by adjusting the resistance values of the plurality of regulating resistors LDR1 and LDR2.

It is to be understood, however, that the low drop output regulator electronic circuit 3 that uses the noise filtering circuits 100 according to exemplary embodiments of the present inventive concept is not limited to the configuration and elements shown in FIG. 18.

Figure 19:
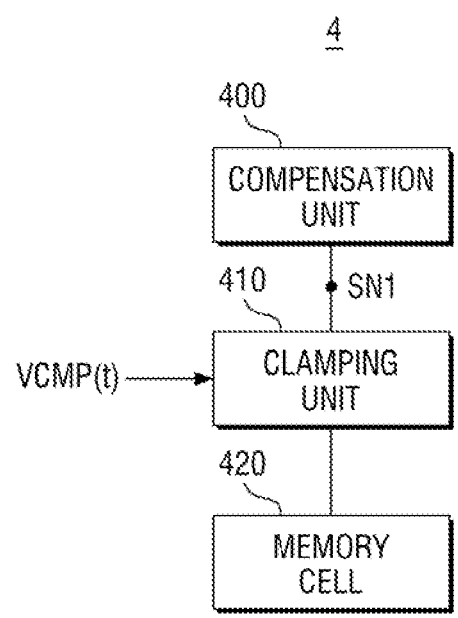
FIG. 19 is a block diagram showing a data read memory device including the noise filtering circuit according to exemplary embodiments of the present inventive concept.
Figure 20:
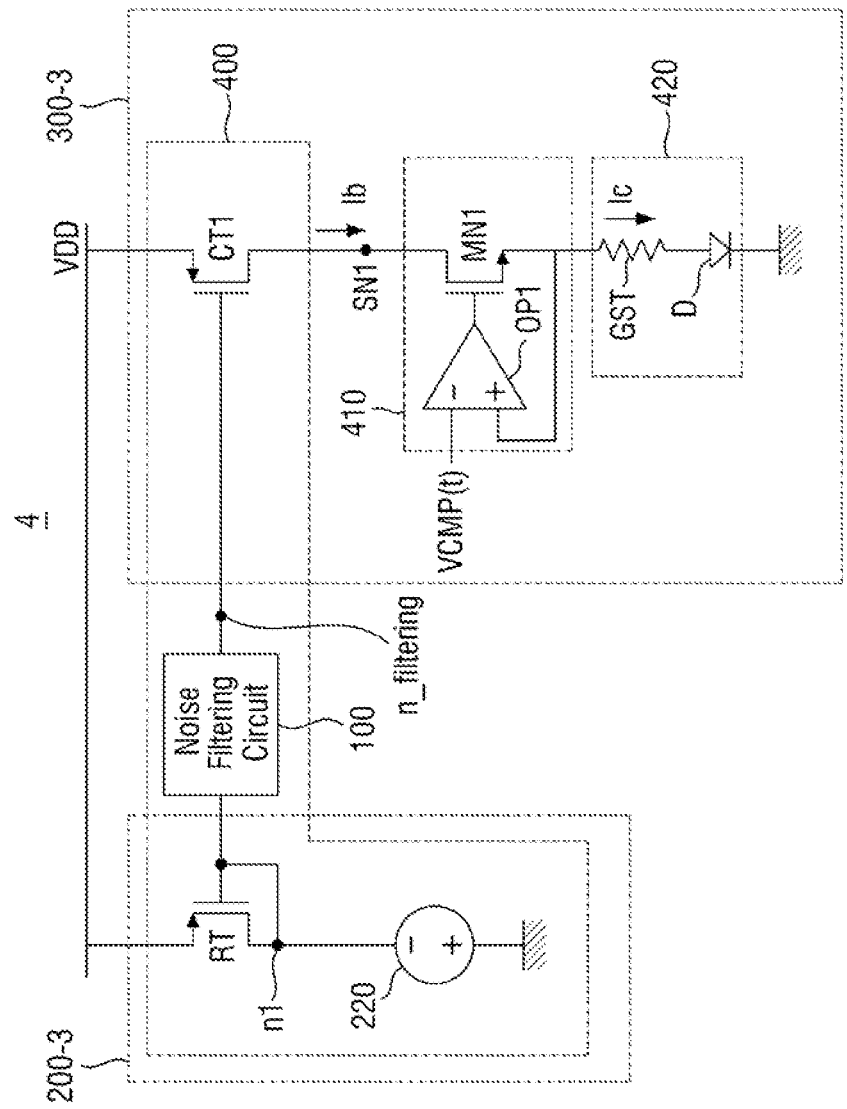
FIG. 20 is a circuit diagram showing a data read memory device including the noise filtering circuit of FIG. 19 according to exemplary embodiments of the present inventive concept.

FIG. 19 is a block diagram showing a data read memory device including the noise filtering circuit according to exemplary embodiments of the present inventive concept. FIG. 20 is a circuit diagram showing a data read memory device including the noise filtering circuit of FIG. 19 according to exemplary embodiments of the present inventive concept.

Referring to FIGS. 1, 19 and 20, a data read memory device 4 including the noise filtering circuit 100 according to exemplary embodiments of the present inventive concept includes a reference bias generating circuit 200-3, the noise filtering circuit 100, and a reference bias receiving circuit 300-3. The noise filtering circuit 100 may include one of the noise filtering circuits (e.g., 100a-1 to 100a-4 and 100b-1 to 100b-10) according to exemplary embodiments of the present inventive concept described above.

The data read memory device 4 including the noise filtering circuit 100 also includes a compensation unit 400, a clamping unit 410, and a memory cell 420.

The memory cell 420 shown in FIG. 19 shows a resistive memory cell selected to read from a number of resistive memory cells in the memory cell array. Here, when the resistive memory cell 420 is a phase change random access memory (PRAM), the resistive memory cell 420 may include a variable resistance element GST including a phase change substance, and an access element D that controls the current flowing through the variable resistance element GST. Here, the access element D may be a diode or a transistor connected in series with the variable resistance element GST. In addition, the phase change substance may use various types of materials, such as GaSb, InSb, InSe, Sb2Te3 and GeTe formed by combining two elements, GeSbTe, GaSeTe, InSbTe, SnSb2Te4 and InSbGe formed by combining three elements, and AgInSbTe, (GeSn)SbTe, GeSb(SeTe) and Te81Ge15Sb2S2 formed by combining four elements. Among them, GeSbTe made up of by germanium (Ge), antimony (Sb) and tellurium (Te) may be used.

When the resistive memory cell 420 is a resistive random access memory (RRAM), the variable resistance element may include, for example, NiO or perovskite. Perovskite may be combinations of manganite ($Pr_{0.7}Ca_{0.3}MnO_3$, $Pr_{0.5}Ca_{0.5}MnO_3$, other PCMO, LCMO, etc.), titanate (STO: Cr), zirconate (SZO:Cr, $Ca_2Nb_2O_7$:Cr, $Ta_2O_5$:Cr) and the like. A filament may be formed in the variable resistance element, and the filament serves as a current path of a cell current flowing through the resistive memory cell.

The compensation unit 400 provides a compensation current Ib to the sensing node SN1. For example, the compensation unit 400 provides the first compensation current Ib to the sensing node SN1 to compensate for a level decrease of the sensing node SN1 caused by the cell current Ic flowing through the selected resistive memory cell 420.

As shown in FIG. 20, such a compensation unit 400 may include a reference transistor RT, a voltage source 220, a noise filtering circuit 100 according to exemplary embodiments of the present inventive concept, and a first copy transistor CT1.

For example, the source terminal of the reference transistor RT may be connected to the power supply voltage VDD, and the gate of the reference transistor RT may be connected to the voltage source 220 through the first input terminal n1. Accordingly, the reference bias generated by the reference bias generating circuit 200-3 may be transferred to the noise filtering circuit 100 through the first input terminal n1. After that, the reference bias generating circuit 200-3 may transfer the output voltage, in which noise is filtered through the noise filtering circuit 100, to the first copy transistor CT1 through the filtering terminal n_filtering. The source terminal of the first copy transistor CT1 is connected to the power supply voltage VDD, and may generate the first compensation current Ib. In other words, the compensation unit 400 may be in the form of a current mirror.

In the data read memory device 4 including the noise filtering circuit 100, the reference bias generating circuit 200-3 and the noise filtering circuit 100 may be connected to each other through the first input terminal n1. In addition, in the data read memory device 4 including the noise filtering circuit 100, the reference bias receiving circuit 300-3 and the noise filtering circuit 100 may be connected to each other through the filtering terminal n_filtering.

In the data read memory device 4 including the noise filtering circuit 100, the clamping unit 410 provides a clamping bias VCMPt to the resistive memory cell 420. In particular, the clamping bias VCMPt changes with time during a read section. The shape of the clamping bias VCMPt may be various. For example, the clamping bias VCMPt may increase with time. Alternatively, the clamping bias VCMPt may increase stepwise with time, or may increase in the form of a k-order function, (where k is a natural number) with time.

A sense amplifier OP1 is connected to the sensing node SN1 and senses a level change of the sensing node SN1. For example, the sense amplifier OP1 compares the level of the sensing node SN1 with the reference level, and outputs the comparison result. The sense amplifier OP1 may be a current sense amplifier or a voltage sense amplifier. The sense amplifier OP1 is connected to the gate of the first transistor MN1, and the output voltage of the sense amplifier OP1 is transferred to the first transistor MN1. The first transistor MN1 may receive the compensation current Ib.

It is to be understood that the data read memory device 4 in which the noise filtering circuit 100 according to exemplary embodiments of the present inventive concept is used is not limited to the configuration and elements shown in FIGS. 19 and 20.

Exemplary embodiments of the present inventive concept provide a noise filtering circuit in which, even if there is a leakage current in a capacitor or a circuit receiving a bias, by compensating for the leakage current, a bias voltage is maintained at a desired voltage to execute effectively the noise filtering.

Exemplary embodiments of the present inventive concept also provide an electronic circuit including a noise filtering circuit that effectively executes the noise filtering.

While the inventive concept has been described with reference to exemplary embodiments thereof, it will be understood by those of ordinary skill in the art that various changes in form and details may be made thereto without departing from the spirit and scope of the inventive concept as set forth by the following claims.

What is claimed is:

1. A noise filtering circuit, comprising:
an amplifier which receives a reference bias through a first input terminal, generates an amplified output voltage and outputs the amplified output voltage through an output terminal, and receives an output voltage generated on the basis of the amplified output voltage through a second input terminal;
a resistance component connected between the output terminal of the amplifier and the second input terminal; and
a capacitor connected to the resistance component,
wherein the resistance component includes a pseudo resistor,
wherein the pseudo resistor includes a first transistor and a second transistor,
a first terminal of the first transistor is connected to the output terminal, and a second terminal and a gate of the first transistor are connected to a common terminal, and
a first terminal of the second transistor is connected to the second input terminal and the capacitor, and a second terminal and a gate of the second transistor are connected to the common terminal.

2. The noise filtering circuit of claim 1, wherein the first transistor and the second transistor each include a p-type metal oxide semiconductor (PMOS) transistor.

3. A noise filtering circuit, comprising:
an amplifier to which a reference bias is input through a first input terminal;
a first capacitor including a first terminal connected to a second input terminal of the amplifier, and a second terminal connected to an output terminal of the amplifier;
a first resistance component including a first terminal connected to the output terminal, and a second terminal connected to a filtering terminal;
a second resistance component including a first terminal connected to the second input terminal, and a second terminal connected to the filtering terminal; and
a second capacitor connected to the filtering terminal,
wherein an output voltage, in which noise of the reference bias is filtered, is output through the filtering terminal.

4. The noise filtering circuit of claim 3, wherein the first resistance component includes a transistor, and
wherein the transistor is connected to the output terminal of the amplifier, the filtering terminal, and an off-voltage.

5. The noise filtering circuit of claim 4, wherein the transistor includes an n-type metal oxide semiconductor (NMOS) transistor.

6. The noise filtering circuit of claim 4, Wherein the transistor includes a p-type metal oxide semiconductor (PMOS) transistor.

7. The noise filtering circuit of claim 3, wherein the second resistance component includes a transistor, and
wherein the transistor is connected to the second input terminal, the filtering terminal, and an off-voltage.

8. The noise filtering circuit of claim 7, wherein the transistor includes an n-type metal oxide semiconductor (NMOS) transistor.

9. The noise filtering circuit of claim 7, wherein the transistor includes a p-type metal oxide semiconductor (PMOS) transistor.

10. The noise filtering circuit of claim 3, wherein the first resistance component includes a pseudo resistor.

11. The noise filtering circuit of claim 10, wherein the pseudo resistor includes a first transistor and a second transistor,
the first transistor is connected to the output terminal, and a common terminal, and
the second transistor is connected to the filtering terminal, and the common terminal.

12. The noise filtering circuit of claim 3, Wherein the second resistance component includes a pseudo resistor.

13. The noise filtering circuit of claim 12, wherein the pseudo resistor includes a first transistor and a second transistor,
the first transistor is connected to the second input terminal, and a common terminal, and
the second transistor is connected to the filtering terminal, and the common terminal.

14. A noise filtering circuit, comprising:
an amplifier including a first input terminal, a second input terminal and an output terminal, wherein the amplifier is configured to receive a reference bias at the first input terminal, generate an amplified output voltage, output the amplified output voltage through the output terminal, and receive an output voltage generated using the amplified output voltage at the second input terminal;
a resistance component connected to the output terminal; and
a capacitor connected to the resistance component,
wherein the resistance component includes a first transistor and a second transistor,
first terminal of the first transistor is connected to the output terminal, and a second terminal and a gate of the first transistor are connected to a common terminal, and
a first terminal of the second transistor is connected to the second input terminal and the capacitor, and a second terminal and a gate of the second transistor are connected to the common terminal.

* * * * *